(12) United States Patent
Thadikaran et al.

(10) Patent No.: US 6,943,605 B2
(45) Date of Patent: Sep. 13, 2005

(54) SCAN CELL DESIGNS FOR A DOUBLE-EDGE-TRIGGERED FLIP-FLOP

(75) Inventors: Paul J. Thadikaran, Portland, OR (US); Nasser A. Kurd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 10/334,436

(22) Filed: Dec. 31, 2002

(65) Prior Publication Data

US 2004/0124881 A1 Jul. 1, 2004

(51) Int. Cl.[7] ............... H03K 3/037; H03K 3/12; H03K 3/286
(52) U.S. Cl. ............... 327/218; 327/211; 327/212
(58) Field of Search ............... 327/199, 202, 327/203, 208–213, 218

(56) References Cited

U.S. PATENT DOCUMENTS

| | | | | |
|---|---|---|---|---|
| 5,130,568 A | * | 7/1992 | Miller et al. | 327/202 |
| 5,646,567 A | * | 7/1997 | Felix | 327/202 |
| 5,656,962 A | * | 8/1997 | Banik | 327/202 |
| 6,300,809 B1 | * | 10/2001 | Gregor et al. | 327/200 |
| 6,348,825 B1 | * | 2/2002 | Galbi et al. | 327/218 |
| 2003/0218488 A1 | * | 11/2003 | Parulkar et al. | 327/218 |
| 2004/0041610 A1 | * | 3/2004 | Kundu | 327/215 |

* cited by examiner

Primary Examiner—Tuan T. Lam
(74) Attorney, Agent, or Firm—Buckley, Maschoff & Talwalkar LLC

(57) ABSTRACT

According to some embodiments, scan cell designs are provided for a double-edge-triggered flip-flop.

29 Claims, 10 Drawing Sheets

SCAN CELL DESIGNS FOR A DOUBLE-EDGE-TRIGGERED FLIP-FLOP

BACKGROUND

An integrated circuit may include scan elements that provide for observation of, and control over, internal states within the integrated circuit. The scan elements may, for example, be used when testing and debugging the integrated circuit.

By way of example, a scan cell might be associated with a signal pin in order to capture data from and/or apply data to the integrated circuit. To provide for high observability and controllability, it may be desirable to have scan cells associated with many of the state elements in the integrated circuit. Moreover, it may be desirable to have each scan cell operate in a number of different modes. For example, a scan cell might be disabled (e.g., during normal operation of the integrated circuit), information in a scan cell might be stored into a state element, information in a state element might be loaded into a scan cell, and/or a scan cell input bit might be shifted into a scan cell output.

DETAILED DESCRIPTION

In the following description, particular types of integrated circuits, circuit configurations, logic blocks, and signals are described for purpose of illustration. It will be appreciated, however, that other embodiments are applicable to other types of integrated circuits, circuit configurations, logic blocks, and signals.

A Double-Edge-Triggered Flip-Flop (DETFF), also referred to as a dual-edge-triggered flip-flop, samples an input signal at both the rising and falling edges of an input clock signal. In contrast, a Single-Edge-Triggered Flip-Flop (SETFF) samples an input signal at only one edge of an input clock signal (e.g., either the rising or falling edge).

Figure 1:
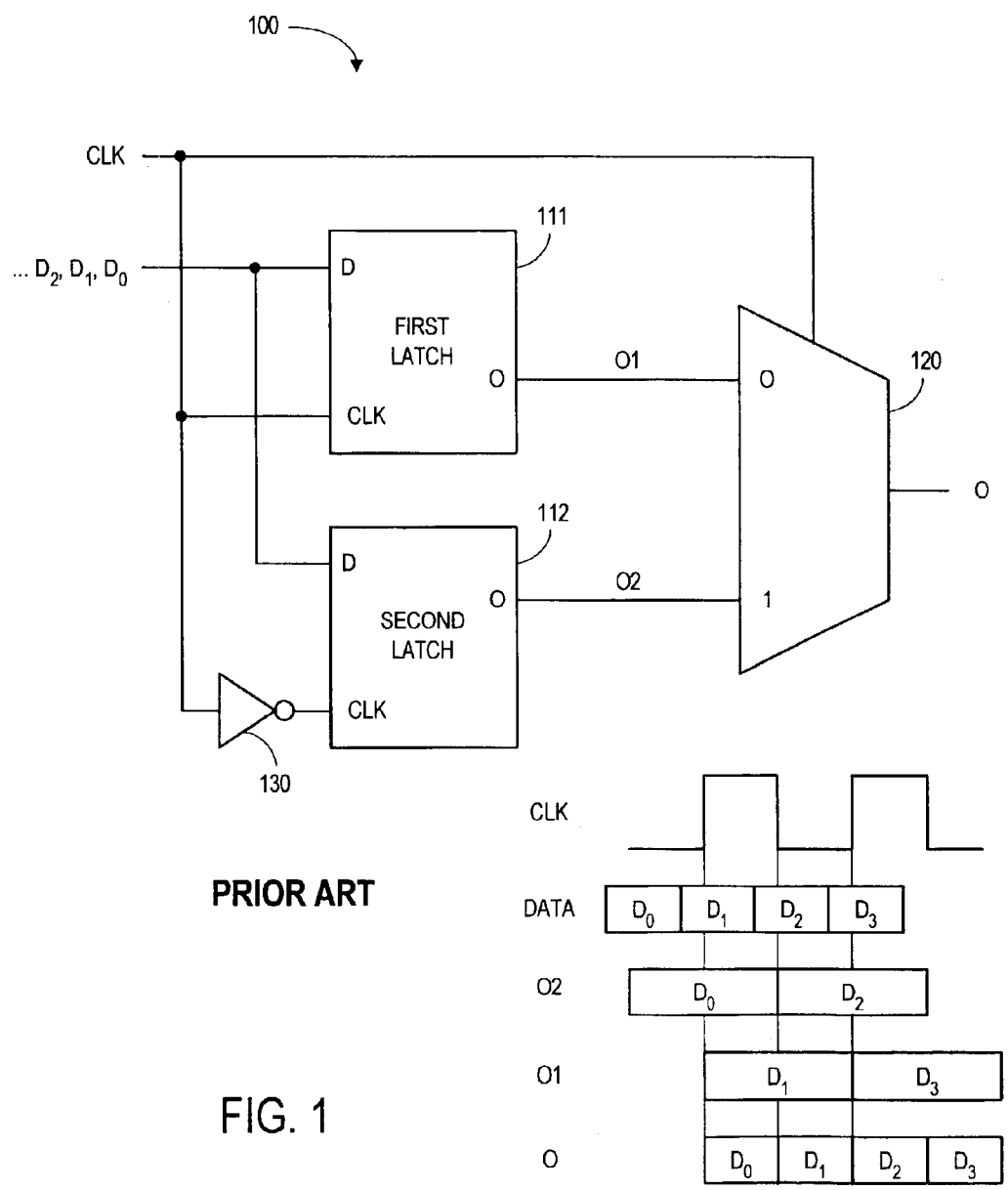
FIG. 1 is a gate-level diagram of a known double-edge-triggered flip-flop.

For example, FIG. 1 is a gate-level diagram of a known DETFF 100. In particular, a first latching element 111 receives an input data bit ("D") along with a clock signal ("CLK"). A second latching element 111 receives the input data bit D along with a signal representing the CLK signal after it passes through an inverter 130. A multiplexer 120 receives outputs from the two latching elements 111, 112 ("O1" and "O2") and selects either O1 or O2 in accordance with the CLK signal in order to generate the DETFF output bit ("O").

Referring now to the signals illustrated in FIG. 1, when the CLK signal initially transitions from zero to one, the first latching element 111 will sample the value of the input data bit $D_1$ (i.e., O1 will become $D_1$). Note that the output of the multiplexer 120, however, is the output of the second latching element 112 (O2, which is associated with a prior value of the input data bit $D_0$). When the CLK signal subsequently transitions to zero, the multiplexer 120 provides $D_1$ as the output of the DETFF 100. Moreover, a new value of input data bit $D_2$ is sampled by the second latching element 112. In this way, data race-through is prevented (e.g., there is no time borrowing across the DETFF 100).

Because the DETFF 100 captures data on both the rising and falling edges, it can capture data at the same rate as a SETFF while operating at a clock frequency that is only half of the SETFF clock frequency. Note that reducing the frequency of a clock signal can reduce the amount of power that is dissipated. Thus, the use of a DETFF 100 may result in significant power savings—especially since clock power may represent a substantial portion of overall toggle power in an integrated circuit. Such power savings may become more important as a clock frequency increases to meet performance requirements.

It may be desirable to have scan capability associated with the DETFF 100 (e.g., a full or partial scan capability). For example, it may be advantageous to scan data into and/or read data from the DETFF 100 in a controllable and observable manner (e.g., to provide visibility into internal states related to the DETFF 100 when a host integrated circuit is in test mode).

DETFF and Multiple Scan Devices

Figure 2:
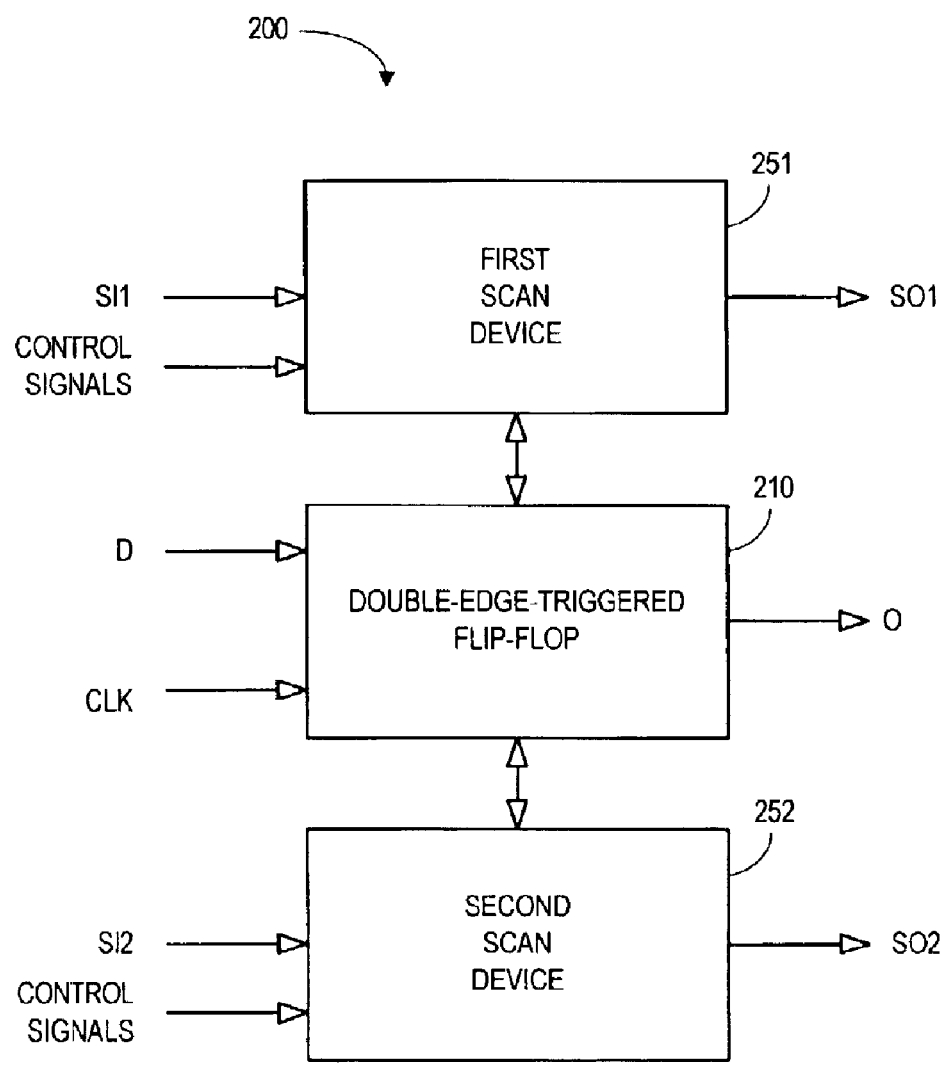
FIG. 2 is a block diagram of an apparatus including a double-edge-triggered flip-flop and multiple scan devices in accordance with some embodiments.

FIG. 2 is a block diagram of an apparatus 200 including a DETFF 210 and multiple scan devices 251, 252 in accordance with some embodiments. As before, the DETFF 210 receives an input data bit D along with a CLK signal and provides an output bit O.

The first scan device 251 receives a first scan input signal ("SI1") along with a first set of scan control signals and provides a first scan output signal ("SO1"). Similarly, the second scan device 252 receives a second scan input signal ("SI2") along with a second set of scan control signals and provides a second scan output signal ("SO2"). Note that the first scan device 251 and the second scan device 252 may also exchange information with the DETFF 210.

Recall that the DETFF 210 may include two latching elements (as described with respect to FIG. 1). In this case, according to some embodiments, the first scan device 251 is associated with one latching element while the second scan device 252 is associated with the other latching element.

Figure 3:
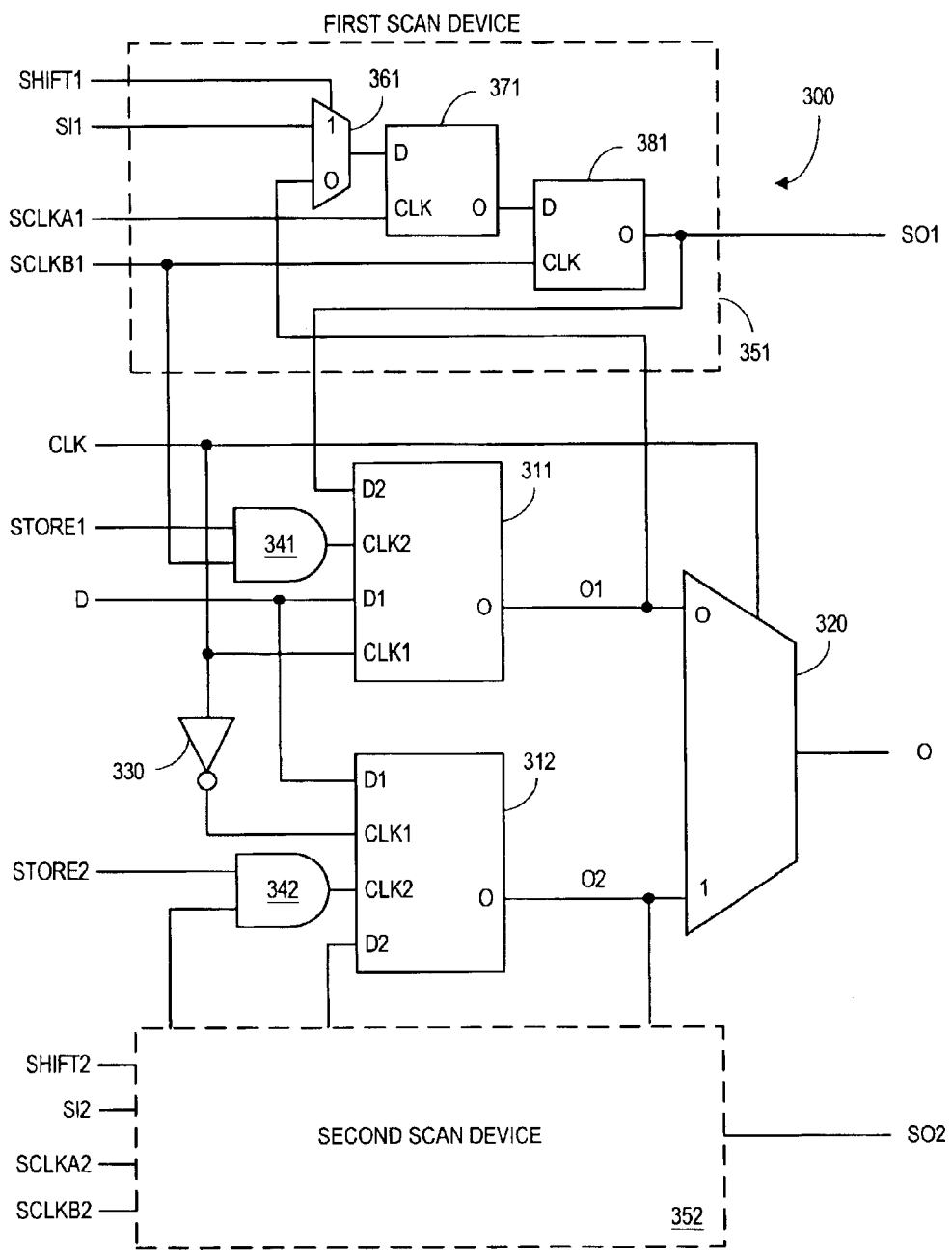
FIG. 3 is an example of an apparatus including a double-edge-triggered flip-flop and multiple scan devices in accordance with some embodiments.

FIG. 3 is an example of an apparatus 300 including a DETFF and multiple scan devices 351, 352 in accordance with some embodiments. As in FIG. 1, a first latching element 311 receives an input data bit D and a CLK signal and provides an output O1 to a multiplexer 320. Similarly, a second latching element 312 receives the input data bit D and an inverted CLK signal (i.e., after the CLK signal passes through an inverter 330) and provides an output O2 to the multiplexer 320. The multiplexer 320 then selects either O1 or O2 as an output O in accordance with the CLK signal.

In this embodiment, however, the first latching element 311 comprises a dual-port latching element. That is, the first latching element 311 also receives a second input data bit ("D2") and an associated second clock signal ("CLK2").

Consider now the first scan device 351 (associated with the first latching element 311). The first scan device 351 receives a shift signal ("SHIFT1"), an input bit ("SI1"), and two clock signals ("SCLKA1" and "SCLKB1").

Moreover, the first scan device 351 includes a multiplexer 361 that receives SI1 along with O1 and provides an output in accordance with SHIFT1. A master latch 371 receives the output of the multiplexer 361 along with SCLKA1. A slave latch 381 receives an output of the master latch 371 along with SCLKB1 and generates the output of the first scan device 351 ("SO1").

Note that the first latching element's second clock signal ("CLK2") represents a first store bit ("STORE1") combined with SCLKB1 via an AND operation 341. In addition, the associated second input data bit ("D2") represents SO1.

The second latching element 312 is also a dual-port latching element and receives a second input data bit ("D2") and an associated second clock signal ("CLK2"). Consider now the second scan device 352 (associated with the second latching element 312). The second scan device 352 receives a shift signal ("SHIFT2"), an input bit ("SI2"), and two clock signals ("SCLKA2" and "SCLKB2").

Although not shown in FIG. 3 for clarity, the second scan device 352 includes a multiplexer that receives SI2 along with O2 and provides an output in accordance with SHIFT2. A master latch receives the output of that multiplexer along with SCLKA2. A slave latch receives an output of that master latch along with SCLKB2 and generates the output of the second scan device 352 ("SO2").

Note that the second latching element's second clock signal ("CLK2") represents a second store bit ("STORE2") combined with SCLKB2 via an AND operation 341. In addition, the associated second input data bit ("D2") represents SO2.

Figure 4:
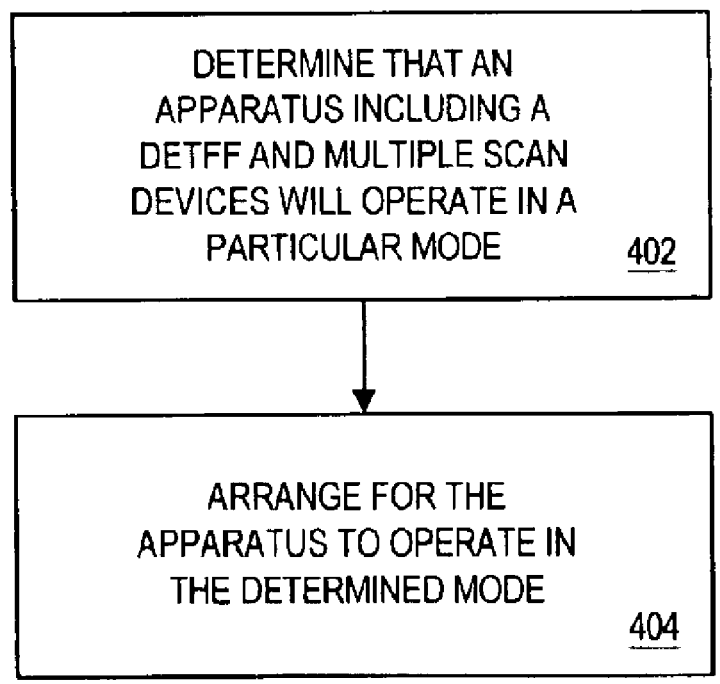
FIG. 4 is a flow chart of a method according to some embodiments.

FIG. 4 is a flow chart of a method according to some embodiments. The method may be associated with, for example, the apparatus 300 of FIG. 3. Note that the flow charts described herein do not necessarily imply a fixed order to the actions, and embodiments may be performed in any order that is practicable.

At 402, it is determined that an apparatus including a DETFF and multiple scan devices will operate in a particular mode. At 404, it is arranged for the DETFF to operate in the determined mode.

For example, it may be determined that the apparatus should operate in a mode associated with normal operation (e.g., the value of D should be transferred to O). In this case, both STORE1 and STORE2 may be set to zero. As a result, the second clock input (CLK2) of each latching element 311, 312 is held to zero (i.e., because the zero prorogates through the AND gates 341, 342), and the DETFF operates normally as described with respect to FIG. 1.

As another example, it may be determined that the apparatus should operate in a mode associated with storing a scan device input bit into a latching element output. Consider, for example, the case where SI1 will be stored into O1. Here, CLK and STORE2 may be set to zero and SHIFT1 and STORE1 may be set to one. Because SHIFT1 is one, the multiplexer 361 in the first scan device 351 provides SI1 to the data input of the master latch 371.

A transition of SCLKA1 from zero to one causes SI1 to move to the data input of the slave latch 381. A subsequent transition of SCLKB1 from zero to one moves SI1 to the output of the slave latch 381 (i.e., SO1 is now equal to SI1). Moreover, that transition of SCLKB1 from zero to one also causes the AND gate 341 to trigger the first latching element 311 (recall that STORE1 was already set to one). As a result, SI1 is stored into O1 (i.e., via D2 of the first latching element 311). Note that because CLK was set to zero, CLK1 of the first latching element 311 remains zero during this process.

Consider now the similar case where SI2 will be stored into O2. In this case, STORE1 may be set to zero and SHIFT2 and STORE2 may be set to one. Because SHIFT2 is one, a multiplexer in the second scan device 352 provides SI2 to the data input of a master latch. A transition of SCLKA2 from zero to one causes SI2 to move to the data input of a slave latch. A subsequent transition of SCLKB2 from zero to one moves SI2 to the output of the slave latch (i.e., SO2 is now equal to SI2). Moreover, that transition of SCLKB2 from zero to one causes the AND gate 342 to trigger the second latching element 312 (recall that STORE2 was already set to one). As a result, SI2 is stored into O2 (i.e., via D2 of the second latching element 312). Note CLK must be set to one during this process (so that CLK1 of the second latching element 312 remains zero).

As still another example, it may be determined that the apparatus should operate in a mode associated with loading a latching element output bit into a scan device output. Consider, for example, the case where O1 will be loaded into SO. Here, SHIFT1, STORE1, and STORE2 may be set to zero. Because SHIFT1 is zero, the multiplexer 361 in the first scan device 351 provides O1 to the data input of the master latch 371. A transition of SCLKA1 from zero causes O1 to move to the data input of the slave latch 381. A subsequent transition of SCLKB1 from zero to one moves O1 to the output of the slave latch 381 (i.e., SO1 is now equal to O1). As a result, O1 is loaded into SO1.

Consider now the similar case where O2 will be loaded into SO2. In this case, SHIFT2, STORE2, and STORE1 may be set to zero. Because SHIFT2 is zero, a multiplexer in the first scan device 352 provides O2 to the data input of a master latch. A transition of SCLKA2 from zero to one causes O2 to move to the data input of a slave latch. A subsequent transition of SCLKB2 from zero to one moves O2 to the output of the slave latch (i.e., SO2 is now equal to O2). As a result, O2 is loaded into SO2.

As yet another example, it may be determined that the apparatus should operate in a mode associated with shifting a scan device input bit into a scan device output. Consider, for example, the case where SI1 will be shifted into SO1, and SI2 will be shifted into SO2 (e.g., at substantially the same time). Here, SHIFT1 and SHIFT2 may be set to one and STORE1 and STORE2 may be set to zero. Because SHIFT1 is one, the multiplexer 361 in the first scan device 351 provides SI1 to the data input of the master latch 371. A transition of SCLKA1 from zero to one causes SI1 to move to the data input of the slave latch 381. A subsequent transition of SCLKB1 from zero to one moves SI1 to the output of the slave latch 381 (i.e., SO1 is now equal to SI1). As a result, SI1 is shifted into SO1. A similar process occurs with respect to the second scan device 352.

Finally, it may be determined that the apparatus should operate in a mode associated with disabling the scan devices 351, 352. In this case, STORE1, SCLKA1, SCLKB1, STORE2, SCLKA2, and SCLKB2 may simply be set to zero.

Thus, a DETFF associated with multiple scan devices (e.g., the first scan device 351 associated with the first latching element 311 and the second scan device 352 associated with the second latching element 312) may provide a high degree of observability and control. That is, such an approach may provide a substantially full-scanned design. Note, however, that the two scan devices 351, 352 might occupy a significant amount of area in an integrated processor. Also note that scan device input bits cannot be stored into latching element output for both scan devices at substantially the same time according to some embodiments. For example, SI1 cannot be stored into O1 at the same time as S12 is being stored into O2 (i.e., because CLK must be set to zero when storing SI1 into O1 and CLK must be set to one when storing S12 into O2).

DETFF and Single Scan Device

Figure 5:
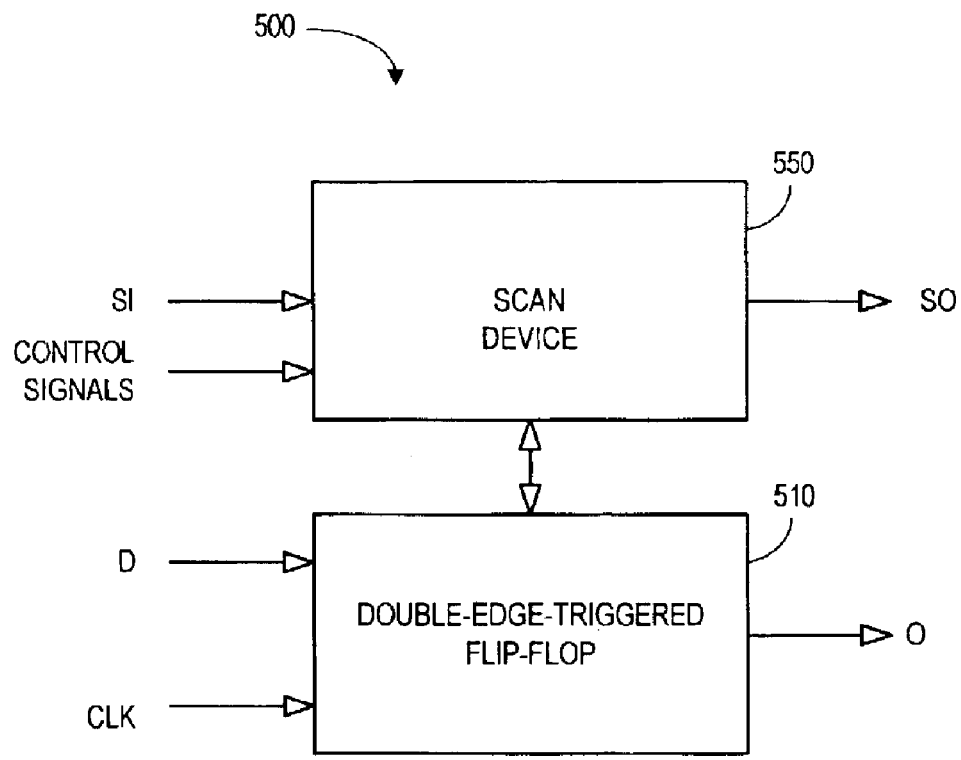
FIG. 5 is a block diagram of an apparatus including a double-edge-triggered flip-flop and a scan device in accordance with some embodiments.

FIG. 5 is a block diagram of an apparatus 500 including a DETFF 510 and a scan device 550 in accordance with some embodiments. As before, the DETFF 510 receives an input data bit D along with a CLK signal and provides an output bit O.

The scan device 550 receives a scan input signal ("SI") along with a set of scan control signals and provides a scan output signal ("SO"). Note that the scan device 550 may also exchange information with the DETFF 510.

Recall that the DETFF 510 may include two latching elements (as described with respect to FIG. 1). In this case, according to some embodiments, the scan device 550 might be associated with only one of the latching elements (as described with respect to FIGS. 6 and 7) or with both of the latching elements (as described with respect to FIGS. 8 and 9).

DETFF and Scan Device Associated with One Latching Element

Figure 6:
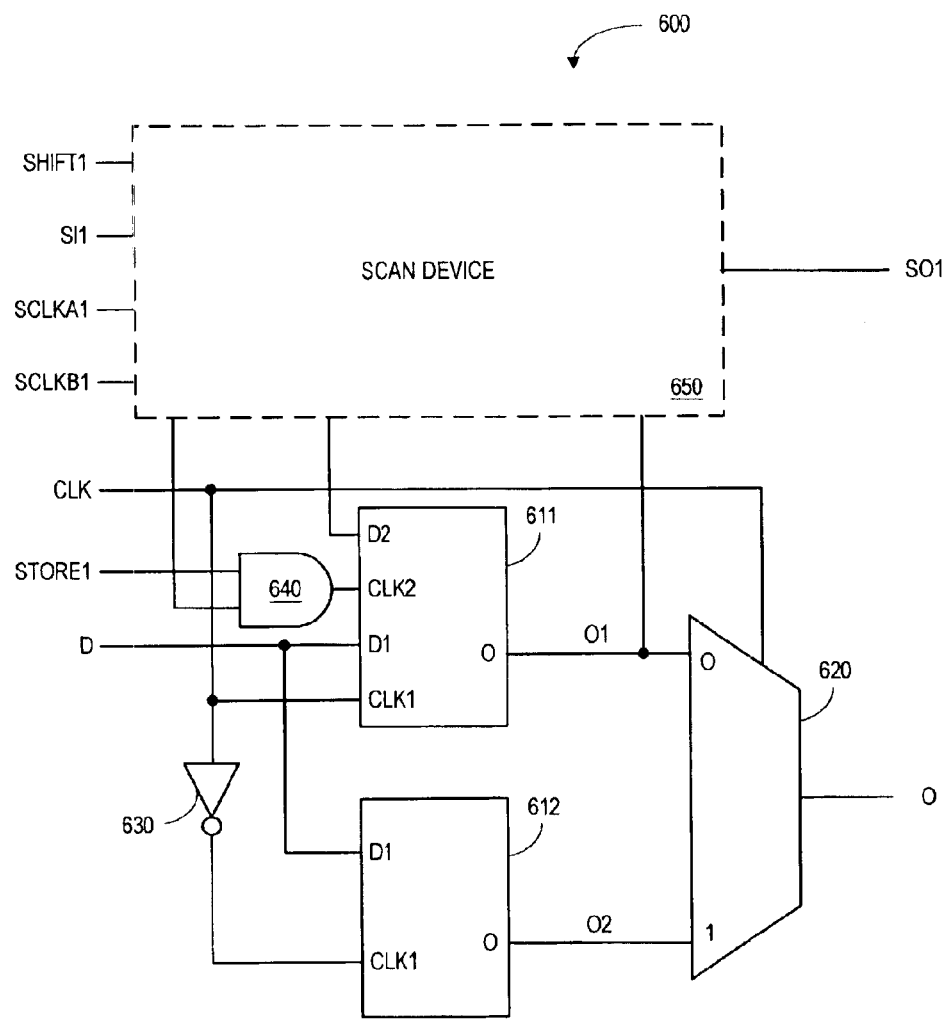
FIG. 6 is an example of an apparatus including a double-edge-triggered flip-flop and a scan device in accordance with some embodiments.

FIG. 6 is an example of an apparatus 600 including a DETFF and a scan device 650 in accordance with some embodiments. As in FIG. 3, a first latching element 611 receives an input data bit D along with a CLK signal and provides an output O1 to a multiplexer 620. Similarly, a second latching element 612 receives the input data bit D and an inverted CLK signal (i.e., after the CLK signal pass through an inverter 630) and provides an output O2 to the multiplexer 620. The multiplexer 630 then selects either O1 or O2 as an output O in accordance with the CLK signal.

Moreover, the first latching element 611 comprises a dual-port latching element. That is, the first latching element 611 also receives a second input data bit ("D2") and an associated second clock signal ("CLK2"). Consider now the scan device 650, which is associated with the first latching element 611. The scan device 650 receives a shift signal ("SHIFT1"), an input bit ("SI1"), and two clock signals ("SCLKA1" and "SCLKB").

Although not shown in FIG. 6 for clarity, the scan device 650 includes the same elements as illustrated in FIG. 3 with respect to the first scan device 351. In particular, the scan device 650 includes a multiplexer adapted to receive SI1 along with O1 and to provide an output in accordance with SHIFT1. A master latch receives the output of the multiplexer along with SCLKA1. A slave latch receives an output of the master latch along with SCLKB1 and generates the output of the scan device 650 ("SO1").

Note that the first latching element's second clock signal ("CLK2") represents a first store bit ("STORE1") combined with SCLKB1 via an AND operation 640. In addition, the associated second input data bit ("D2") represents SO1.

According to this embodiment, and unlike the embodiment illustrated in FIG. 3, no second scan device is provided for the second latching element 612 (and the second latching element 612 may simply be a single-port latching element).

Figure 7:
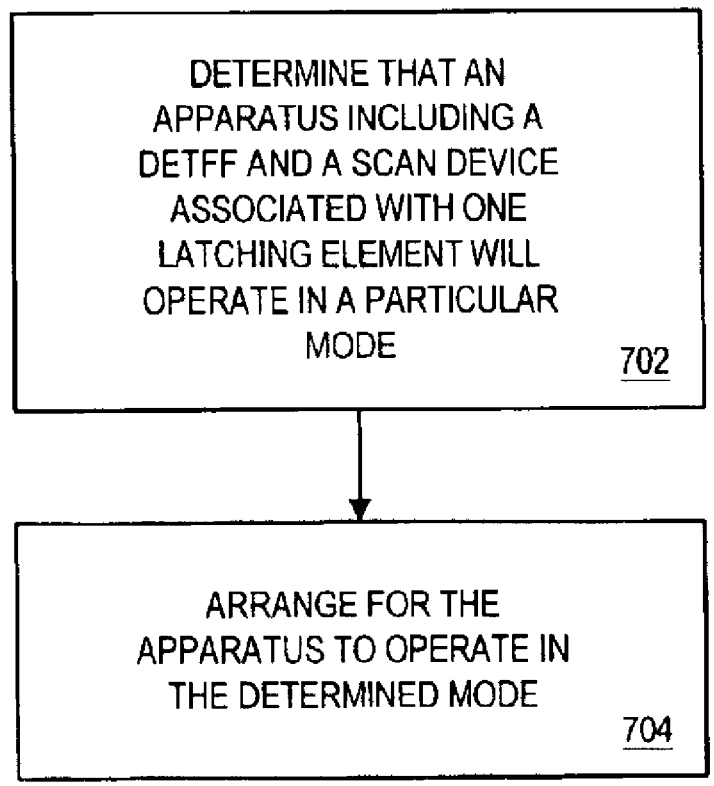
FIG. 7 is a flow chart of a method according to some embodiments.

FIG. 7 is a flow chart of a method according to some embodiments. The method may be associated with, for example, the apparatus 600 of FIG. 6. At 702, it is determined that an apparatus including a DETFF and a scan device associated with one latching element will operate in a particular mode. At 704, it is arranged for the DETFF to operate in the determined mode.

With respect to the first latching element 611, the method of FIG. 7 is similar to that described with respect to FIGS. 3 and 4. For example, it may be determined that the apparatus should operate in a mode associated with normal operation. As another example, it may be determined that the apparatus should operate in a mode associated with storing SI1 into O1. As still another example, it may be determined that the apparatus should operate in a mode associated with loading O1 into SO1. As yet another example, it may be determined that the apparatus should operate in a mode associated with shifting SI1 into SO1. Finally, it may be determined that the apparatus should operate in a mode associated with disabling the scan device.

Because there is no scan device associated with the second latching element 612, however, some of the modes described with respect to FIGS. 3 and 4 are not available. For example, a scan device input bit cannot be stored into O2. Similarly, O2 cannot be loaded into a scan device output bit. In other words, the embodiment described with respect to FIGS. 6 and 7 is a partially scanned design. Although this embodiment may have less functionality, the amount of area required to implement the design in an integrated circuit may be approximately half of the area that was required with respect to FIGS. 3 and 4 (i.e., because there is only one scan device instead of two).

In the embodiment of FIGS. 6 and 7, the first latching element 611 is associated with the scan device 650 while the second latching element 612 is associated with no scan device. It should be appreciated, however, that in another embodiment the second latching element 612 could be associated with a scan device while the first latching element 611 is associated with no scan device.

DETFF and Scan Device Associated with Both Latching Elements

Figure 8:
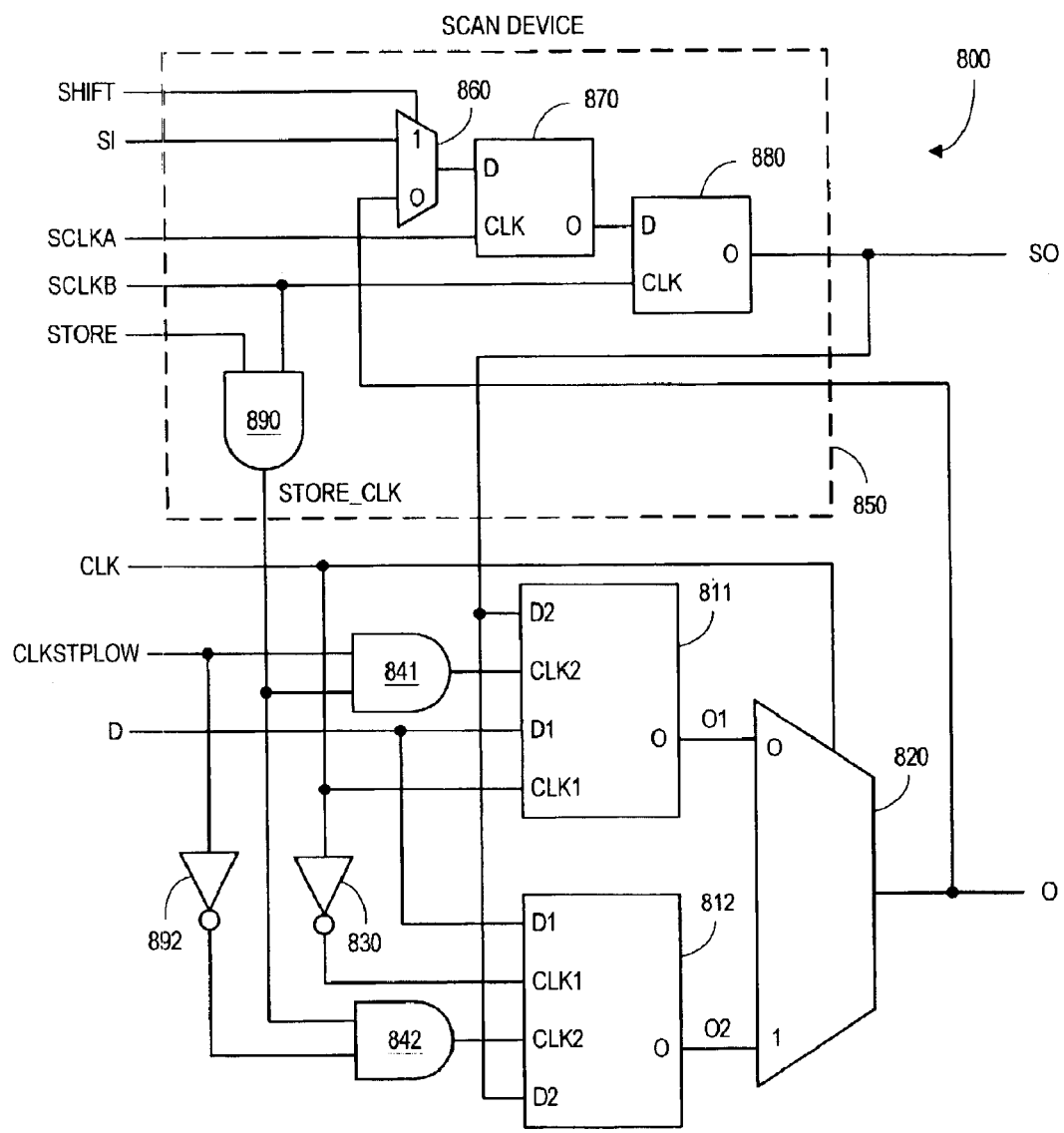
FIG. 8 is an example of an apparatus including a double-edge-triggered flip-flop and a scan device in accordance with some embodiments.

FIG. 8 is an example of an apparatus 800 including a DETFF and a scan device 850 in accordance with another embodiment. As in FIG. 3, a first latching element 811 receives an input data bit D along with a CLK signal and provides an output O1 to a multiplexer 820. Similarly, a second latching element 812 receives the input data bit D and an inverted clock signal (i.e., inverted by an inverter 830) and provides an output O2 to the multiplexer 820. The multiplexer 820 then selects with O1 or O2 as an output O in accordance with the CLK signal.

The latching elements 811, 812 are dual-port latching elements. That is, the first latching element 811 also receives a second input data bit ("D2") and an associated second clock signal ("CLK2"). The second latching element 812 also receives a second input data bit ("D2") and an associated second clock signal ("CLK2").

Consider now the scan device 850 (associated with both latching elements 811, 812). The scan device 850 receives a shift signal ("SHIFT"), an input bit ("SI"), and two clock signals ("SCLKA" and "SCLKB").

The scan device 850 also includes a multiplexer 860 adapted to receive SI along with O and to provide an output in accordance with SHIFT. A master latch 870 receives the output of the multiplexer 860 along with SCLKA. A slave latch 880 receives an output of the master latch 870 along with SCLKB and generates the output of the scan device 850 ("SO"). Note that SO is coupled to D2 for both of the latching elements 811, 812.

According to this embodiment, a STORE signal is also provided to the scan device 850. The STORE signal is combined with the SCLKB via an AND operation 890 to create a store clock signal ("STORE_CLK").

Moreover, according to this embodiment, a clock stop low signal ("CLKSTPLOW") is provided to the DETFF. In particular, the first latching element's second clock signal ("CLK2") represents CLKSTPLOW combined with STORE_CLK via an AND operation 841. The second latching element's second clock signal ("CLK2") represents an inverted CLKSTPLOW (i.e., after being inverted by inverter 892) combined with STORE_CLK via an AND operation 842.

Figure 9:
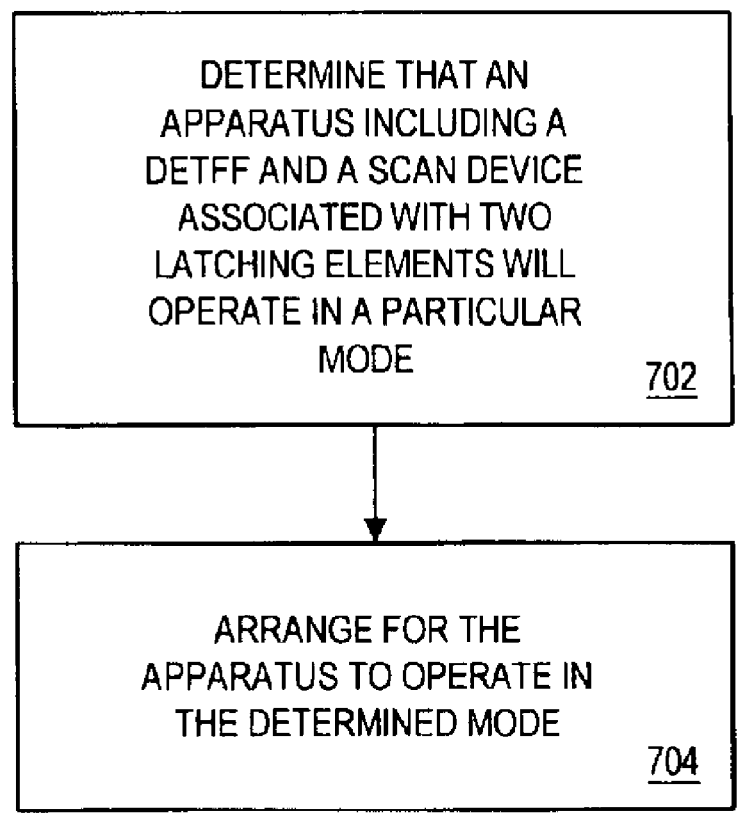
FIG. 9 is a flow chart of a method according to some embodiments.

FIG. 9 is a flow chart of a method according to some embodiments. The method may be associated with, for example, the apparatus 800 of FIG. 8. At 902, it is determined that an apparatus including a DETFF and a scan device associated with two latching elements will operate in a particular mode. At 904, it is arranged for the DETFF to operate in the determined mode.

For example, it may be determined that the apparatus should operate in a mode associated with normal operation (e.g., the value of D should be transferred to O). In this case, STORE may be set to zero. As a result, the second clock input of both latching elements 811, 813 (CLK2) is held at zero (e.g., after the zero propagates through the AND gates 890, 841, 842), and the DETFF will operate as in FIG. 1.

As another example, it may be determined that the apparatus should operate in a mode associated with storing a scan device input bit into a latching element output. Consider, for example, the case where SI will be stored into O1. Here, CLK may be set to zero and SHIFT, STORE, and CLKSTPLOW may be set to one. Because SHIFT is one, the multiplexer 860 in the scan device 850 provides SI to the data input of the master latch 870.

A transition of SCLKA from zero to one causes SI to move to the data input of the slave latch 880. A subsequent transition of SCLKB from zero to one moves SI to the output of the slave latch 880 (i.e., SO is now equal to SI). Moreover, the transition of SCLKB from zero to one also causes STORE_CLK to transition to one (i.e., because STORE and SCLKB to the AND gate 890 are now both one). As a result, CLK2 of the first latching element 811 will transition to one (i.e., because STORE_CLK and STPCLKLOW to the AND gate 841 are now both one). Because D2 of the first latching element 811 is SO (which is now equal to SI), SI has now been stored into O1. Note that CLK2 of the second latching element 812 does not transition to one (i.e., because the inverse of STPCLKLOW remains zero).

Consider now the similar case where SI will be stored into O2. In this case, CLKSTPLOW may be set to zero and CLK, SHIFT, and STORE may be set to one. Because SHIFT is one, the multiplexer 860 in the scan device 850 provides SI to the data input of the master latch 870.

A transition of SCLKA from zero to one causes SI to move to the data input of the slave latch 880. A subsequent transition of SCLKB from zero to one moves SI to the output of the slave latch 880 (i.e., SO). Moreover, the transition of SCLKB from zero to one also causes STORE_CLK to transition to one (i.e., because STORE and SCLKB to the AND gate 890 are now both one). As a result, CLK2 of the second latching element 812 will transition to one (i.e., because STORE_CLK and the inverse of STPCLKLOW to the AND gate 842 are now both one). Because D2 of the second latching element 812 is SO (which is now equal to SI), SI has now been stored into O2. Note that CLK2 of the first latching element 811 does not transition to one (i.e., because the STPCLKLOW remains zero).

As still another example, it may be determined that the apparatus should operate in a mode associated with loading a latching element output bit into a scan device output. Consider, for example, the case where O1 will be loaded into SO. Here, SHIFT, STORE, and CLK may be set to zero (i.e., CLK may be stopped low). Since CLK is zero, the output of the multiplexer 820 will be O1. Because SHIFT is zero, the multiplexer 860 in the scan device 850 provides O1 to the data input of the master latch 870. A transition of SCLKA from zero to one causes O1 to move to the data input of the slave latch 880. A subsequent transition of SCLKB from zero to one moves O1 to the output of the slave latch 880 (i.e., SO). As a result, O1 is loaded into SO.

Consider now the similar case where O2 will be loaded into SO. In this case, SHIFT and STORE may be set to zero and CLK may be set to one (i.e., CLK may be stopped high). Since CLK is one, the output of the multiplexer 820 will be O2. Because SHIFT is zero, the multiplexer 860 in the scan device 850 provides O2 to the data input of the master latch 870. A transition of SCLKA from zero to one causes O2 to move to the data input of the slave latch 880. A subsequent transition of SCLKB from zero to one moves O2 to the output of the slave latch 880 (i.e., SO). As a result, O2 is loaded into SO.

As yet another example, it may be determined that the apparatus should operate in a mode associated with shifting a scan device input bit into a scan device output. Consider, for example, the case where SI will be shifted into SO. Here, SHIFT may be set to one and STORE may be set to zero. Because SHIFT is one, the multiplexer 860 in the scan device 850 provides SI to the data input of the master latch 870. A transition of SCLKA from zero to one causes SI to move to the data input of the slave latch 880. A subsequent transition of SCLKB from zero to one moves SI to the output of the slave latch 880 (i.e., SO). As a result, SI is shifted into SO.

Finally, it may be determined that the apparatus should operate in a mode associated with disabling the scan device 850. In this case, STORE, SCLKA, and SCLKB may simply be set to zero.

Thus, an apparatus including a DETFF and a scan device 850 associated with two latching elements 811, 812 may provide a high degree of observability and control. That is, such an approach may provide a substantially full-scanned design. Moreover, the amount of area required to implement the design may be approximately half of the area that was required with respect to FIGS. 4 and 5 (i.e., because there is only one scan device instead of two).

System

Figure 10:
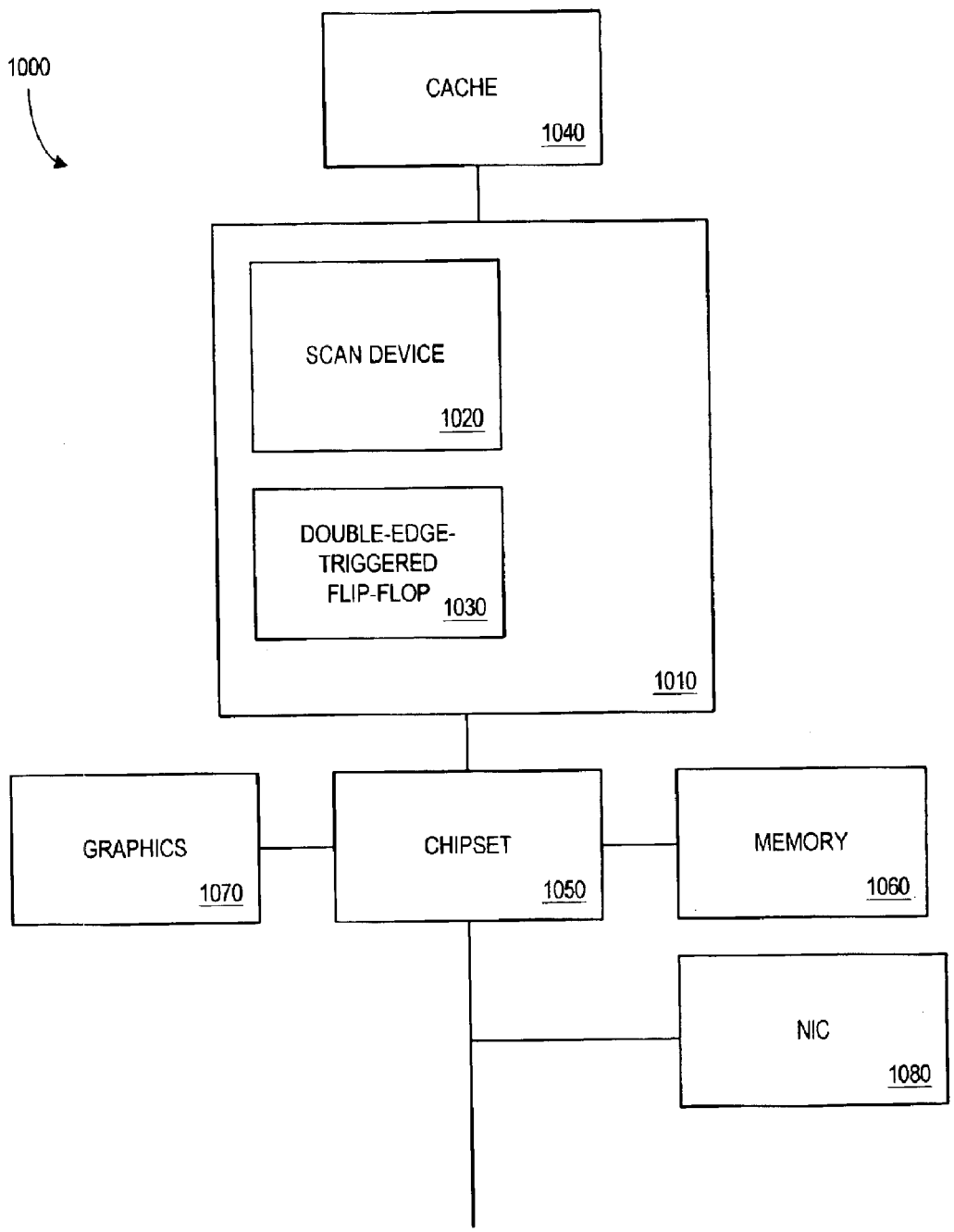
FIG. 10 illustrates a system according to some embodiments.

FIG. 10 is a system 1000 including an integrated circuit 1010 with a scan device 1020 and an associated DETFF 1030 according to some embodiments. The integrated circuit 1010 may be a microprocessor or another type of integrated circuit. According to some embodiments, the integrated circuit 1010 also communicates with an off-die cache 1040. The integrated circuit 1010 may also communicate with a system memory 1060 via a host bus and a chipset 1050. In addition, other off-die functional units, such as a graphics accelerator 1070 and a Network Interface Controller (NIC)

1080 may communicate with the integrated circuit 1010 via appropriate busses.

The scan device 1020 and the DETFF 1030 may be associated with any of the embodiments disclosed herein, including those of FIGS. 2 through 9. The integrated circuit 1010 may also include a clock generator circuit (not shown in FIG. 10) to generate a DETFF clock signal. The integrated circuit 1010 may be associated with, for example, a microprocessor or any other type of integrated circuit for which a scan capable DETFF is desired.

The system 1000 may also be associated with other devices. The other devices might include, for example, one or more input devices through which a user may control the mode of the DETFF 1030 and/or the scan device 1020, provide test data, or otherwise control the integrated circuit 1010 during a testing or debugging operation. The other devices might also include one or more output devices that enable a user to observe results of testing or debugging operations, including data that is scanned from the scan device 1020 and/or other scan elements.

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, complementary signals and/or logic may be used for various embodiments, well-known circuit elements and/or signals may be implemented to or provided in a variety of different ways, and/or a variety of different host integrated circuits may implement such designs.

The several embodiments described herein are solely for the purpose of illustration. Persons skilled in the art will recognize from this description other embodiments may be practiced with modifications and alterations limited only by the claims.

What is claimed is:

1. An apparatus, comprising:
a Double-Edge-Triggered Flip-Flop (DETFF), including a first and a second latching element, to receive a DETFF input bit along with a DETFF clock signal and to provide a DETFF output bit;
a first scan device, associated with the first latching element, to receive a first scan device input bit and to provide a first scan device output bit, wherein the first latching element comprises a dual-port latching element and is to receive:
a first input bit representing the DETFF input bit,
a first clock signal associated with the first input bit and representing the DETFF clock signal,
a second input bit representing the first scan device output bit, and
a second clock signal associated with the second input bit; and
a second scan device, associated with the second latching element, to receive a second scan device input bit and to provide a second scan device output bit.

2. The apparatus of claim 1, wherein the first latching element is to provide a first latching element output bit.

3. The apparatus of claim 2, wherein the DETEF further comprises a multiplexer to: (i) receive the first latching element output bit along with a second latching element output bit, and (ii) provide either the first or second latching element output bit as the DETFF output bit in accordance with the DETFF clock signal.

4. An apparatus, comprising:
a Double-Edge-Triggered Flip-Flop (DETFE), including a first and a second latching element, to receive a DETFF input bit along with a DETFF clock signal and to provide a DETFF output bit;
a first scan device, associated with the first latching element, to receive a first scan device input bit and to provide a first scan device output bit, wherein the first latching element is a dual-port latching element to (i) provide a first latching element output bit and (ii) receive:
a first input bit representing the DETFF input bit,
a first clock signal associated with the first input bit and representing the DETFF clock signal,
a second input bit representing the first scan device output bit, and
a second clock signal associated with the second input bit, and wherein the first scan device comprises:
a first scan device multiplexer to: (i) receive the first scan device input bit along with the first latching element output bit, and (ii) provide an output in accordance with a first scan device shift signal,
a master latch to receive the output of the first scan device multiplexer along with a first scan device clock A signal, and
a slave latch to receive an output of the master latch along with a first scan device clock B signal and to provide the first scan device output bit; and
a second scan device, associated with the second latching element, to receive a second scan device input bit and to provide a second scan device output bit.

5. The apparatus of claim 4, wherein the first latching element's second clock signal represents a first store bit combined with the first scan device clock B signal via an AND operation.

6. The apparatus of claim 5, wherein the second latching element comprises a dual-port latching element and is to receive:
a first input bit representing the DETFF input bit;
a first clock signal associated with the first input bit and representing the inverse of the DETFF clock signal;
a second input bit representing the second scan device output bit; and
a second clock signal associated with the second input bit.

7. The apparatus of claim 6, wherein the second latching element is to provide a second latching element output bit.

8. The apparatus of claim 7, wherein the second scan device comprises:
a second scan device multiplexer to: (i) receive the second scan device input bit along with the second latching element output bit, and (ii) provide an output in accordance with a second scan device shift signal;
a master latch to receive the output of the second scan device multiplexer along with a second scan device clock A signal; and
a slave latch to receive an output of the master latch along with a second scan device clock B signal and to provide the second scan device output bit.

9. The apparatus of claim 8, wherein the second latching element's second clock signal represents a second store bit combined with the second scan device clock B signal via an AND operation.

10. The apparatus of claim 4, wherein the apparatus is to operate in a mode associated with at least one of: (i) normal operation, (ii) storing a scan device input bit into a latching element output, (iii) loading a latching element output bit into a scan device output, (iv) shifting a scan device input bit into a scan device output, or (v) disabling the scan device.

11. An apparatus, comprising:
a Double-Edge-Triggered Flip-Flop (DETFF), including a first and a second latching element, to receive a DETFF input bit along with a DETFF clock signal and to provide a DETFF output bit; and
a scan device, associated with both the first and second latching elements, to receive a scan device input bit and to provide a scan device output bit, wherein the first latching element comprises a dual-port latching element and is to receive:
 a first input bit representing the DETFE input bit,
 a first clock signal associated with the first input bit and representing the DETFF clock signal,
 a second input bit representing the scan device output bit, and
 a second clock signal associated with the second input bit.

12. The apparatus of claim 11, wherein the first latching element is to provide a first latching element output bit.

13. The apparatus of claim 12, wherein the DETFF further comprises a multiplexer to: (i) receive the first latching element output bit along with a second latching element output bit, and (ii) provide either the first or second latching element output bit as the DETEF output bit in accordance with the DETFF clock signal.

14. An apparatus, comprising:
a Double-Edge-Triggered Flip-Flop (DETFF), including a first and a second latching element, to receive a DETFF input bit along with a DETFF clock signal and to provide a DETFF output bit;
a scan device, associated with both the first and second latching elements, to receive a scan device input bit and to provide a scan device output bit, wherein the first latching element is a dual-port latching element to (i) provide a first latching element output bit and (ii) receive:
 a first input bit representing the DETFF input bit,
 a first clock signal associated with the first input bit and representing the DETFF clock signal,
 a second input bit representing the scan device output put bit, and
 a second clock signal associated with the second input bit, and wherein the scan device comprises:
 a scan device multiplexer to: (i) receive the scan device input bit along with the DETFE output bit, and (ii) provide an output in accordance with a scan device shift signal,
 a master latch to receive the output of the scan device multiplexer along with a scan device clock A signal, and
 a slave latch to receive an output of the master latch along with a scan device clock B signal and to provide the scan device output bit.

15. The apparatus of claim 14, wherein the first latching element's second clock signal represents a clock stop low bit combined via an and gate with a store clock signal from the scan device, wherein the store clock signal represents a store signal combined with the scan device clock B signal via an AND operation.

16. The apparatus of claim 15, wherein the second latching element comprises a dual-port latching element and is to receive:
a first input bit representing the DETFF input bit;
a first clock signal associated with the first input bit and representing the inverse of the DETFF clock signal;
a second input bit representing the scan device output bit; and
a second clock signal associated with the second input bit and representing the store clock signal from the scan device combined with the inverse of the clock stop low signal via an and operation.

17. The apparatus of claim 14, wherein the apparatus is to operate in a mode associated with at least one of: (i) normal operation, (ii) storing a scan device input bit into a latching element output, (iii) loading a latching element output bit into a scan device output, (iv) shifting a scan device input bit into a scan device output, or (v) disabling the scan device.

18. A method, comprising:
generating a Double-Edge-Triggered Flip-Flop (DETFF) clock signal for a DETFF associated with at least one scan device, wherein the DETFF includes first and second latching elements and is to generate a DETFF output bit, and wherein the first latching element comprises a dual-port latching element;
providing a first input bit, representing a DETFF input bit, to the first latching element;
providing the DETFF clock signal to an input of the first latching element that is associated with the first input bit;
providing a second input bit, representing a scan device output bit, to the first latching element; and
providing a second clock signal to an input of the first latching element that is associated with the second input bit.

19. The method of claim 18, further comprising:
determining a mode of operation associated with at least one of the DETFF or the scan device; and
controlling the mode of operation via at least one of: (i) the DETFF clock signal, (ii) a scan device clock signal, (iii) a shift signal, (iv) a store signal, or (v) a clock stop low signal.

20. The method of claim 19, wherein the mode is associated with at least one of: (i) normal operation, (ii) storing a scan device input bit into a latching element output, (iii) loading a latching element output bit into a scan device output, (iv) shifting a scan device input bit into a scan device output, or (v) disabling the scan device.

21. An integrated circuit, comprising:
a clock generator circuit to generate a DETFF clock signal; and
a Double-Edge-Triggered Flip-Flop (DETFF) associated with at least one scan device, wherein the DETEF includes first and second latching elements and is to receive a DETFF input bit along with the DETFF clock signal and provide a DETFF output bit, wherein the first latching element comprises a dual-port latching element and is to receive:
 a first input bit representing the DETFF input bit,
 a first clock signal associated with the first input bit and representing the DETEF clock signal,
 a second input bit representing a scan device output bit, and
 a second clock signal associated with the second input bit.

22. The integrated circuit of claim 21, wherein the integrated circuit comprises a microprocessor.

23. A system, comprising:
a chipset; and a die comprising a microprocessor in communication with the chipset, wherein the microprocessor includes:
a Double-Edge-Triggered Flip-Flop (DETFF) associated with at least one scan device, wherein the DETFF includes first and second latching elements and is to receive a DETFF input bit along with the DETFF clock signal and provide a DETFF output bit, wherein the first latching element comprises a dual-port latching element and is to receive:
a first input bit representing the DETFF input bit,
a first clock signal associated with the first input bit and representing the DETFF clock signal,
a second input bit representing a scan device output bit, and
a second clock signal associated with the second input bit.

24. An apparatus, comprising:
a Double-Edge-Triggered Flip-Flop (DETFF) associated with at least one scan device, wherein the DETFF includes first and second latching elements and is to receive a DETFF input bit along with a DETFF clock signal and is to provide a DETFF output bit, wherein the first latching element comprises a dual-port latching element and is to receive:
a first input bit representing the DETFF input bit,
a first clock signal associated with the first input bit and representing the DETFF clock signal,
a second input bit representing a scan device output bit, and
a second clock signal associated with the second input bit.

25. The apparatus of claim 24, wherein the apparatus includes a first scan device associated with the first latching element and a second scan device associated with the second latching element.

26. The apparatus of claim 24, wherein no scan device is associated with the second latching element.

27. The apparatus of claim 25, wherein the scan device is associated with both the first and second latching elements.

28. The apparatus of claim 25, wherein the apparatus is to operate in a mode controlled via at least one of: (i) the DETEF clock signal, (ii) a scan device clock signal, (iii) a scan device shift signal, or (v) a latching element store signal.

29. The apparatus of claim 28, wherein the mode is associated with at least one of: (i) normal operation, (ii) storing a scan device input bit into a latching element output, (iii) loading a latching element output bit into a scan device output, (iv) shifting a scan device input bit into a scan device output, or (v) disabling the scan device.

* * * * *